United States Patent
Van Brunt et al.

(10) Patent No.: US 12,237,412 B2
(45) Date of Patent: Feb. 25, 2025

(54) PROTECTION STRUCTURES FOR SEMICONDUCTOR DEVICES WITH SENSOR ARRANGEMENTS

(71) Applicant: Wolfspeed, Inc., Durham, NC (US)

(72) Inventors: Edward Robert Van Brunt, Raleigh, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/087,740

(22) Filed: Nov. 3, 2020

(65) Prior Publication Data

US 2022/0140138 A1 May 5, 2022

(51) Int. Cl.
*H01L 29/78* (2006.01)
*H01L 27/088* (2006.01)
(Continued)

(52) U.S. Cl.
CPC ...... *H01L 29/7815* (2013.01); *H01L 29/1095* (2013.01); *H01L 29/1608* (2013.01);
(Continued)

(58) Field of Classification Search
CPC .............. H01L 29/1095; H01L 29/1608; H01L 29/42364; H01L 29/4238; H01L 29/66712;
(Continued)

(56) References Cited

U.S. PATENT DOCUMENTS

| | | | | |
|---|---|---|---|---|
| 5,453,390 A | * | 9/1995 | Nishizawa | .......... H01L 29/7815 257/E21.418 |
| 2008/0001221 A1 | * | 1/2008 | Yoshimura | .......... H01L 29/7815 257/E29.136 |

(Continued)

FOREIGN PATENT DOCUMENTS

| | | |
|---|---|---|
| JP | H0613618 A | 1/1994 |
| JP | 2006054278 A | 2/2006 |

(Continued)

OTHER PUBLICATIONS

Lee et. al., "Comparison etween CVD and Thermal Oxide Dielectric Integrity", pp. 506-509, IEEE Electron Device Letters, vol. EDL-7, No. 9, Sep. 1986 (Year: 1986).*

(Continued)

*Primary Examiner* — Britt D Hanley
*Assistant Examiner* — Victor V Barzykin
(74) *Attorney, Agent, or Firm* — Myers Bigel, P.A.

(57) ABSTRACT

Semiconductor devices, and in particular protection structures for semiconductor devices that include sensor arrangements are disclosed. A semiconductor device may include a sensor region, for example a current sensor region that occupies a portion of an overall active area of the device. The current sensor region may be configured to provide monitoring of device load currents during operation. Semiconductor devices according to the present disclosure include one or more protection structures that are configured to allow the semiconductor devices to withstand transient (Continued)

voltage events without device failure. A protection structure may include an insulating layer that is provided in a transition region between a device region and the sensor region of the semiconductor device. In the example of an insulated gate semiconductor device, the insulating layer of the protection structure may include a material with a greater breakdown voltage than a breakdown voltage of a gate insulating layer.

40 Claims, 7 Drawing Sheets

(51) Int. Cl.
    *H01L 29/10*     (2006.01)
    *H01L 29/16*     (2006.01)
    *H01L 29/423*     (2006.01)
    *H01L 29/66*     (2006.01)
    H01L 21/8234     (2006.01)

(52) U.S. Cl.
    CPC .. *H01L 29/42364* (2013.01); *H01L 29/66068* (2013.01); *H01L 21/823481* (2013.01); *H01L 21/823487* (2013.01); *H01L 27/088* (2013.01); *H01L 29/4238* (2013.01); *H01L 29/66712* (2013.01); *H01L 29/7802* (2013.01); *H01L 29/7811* (2013.01)

(58) Field of Classification Search
    CPC ............. H01L 29/7802; H01L 29/7811; H01L 29/7815
    See application file for complete search history.

(56) References Cited

U.S. PATENT DOCUMENTS

| | | |
|---|---|---|
| 2010/0148254 A1 | 6/2010 | Park |
| 2013/0168700 A1* | 7/2013 | Furukawa ........... H01L 29/7815 257/77 |
| 2014/0084361 A1* | 3/2014 | Saito ................. H01L 29/66712 257/329 |
| 2016/0079411 A1* | 3/2016 | Hino ................... H01L 29/0865 257/77 |
| 2018/0097103 A1* | 4/2018 | Sadamatsu .......... H01L 29/7805 |
| 2020/0303296 A1* | 9/2020 | Matsuno ........... H01L 23/53271 |
| 2020/0328150 A1 | 10/2020 | Lichtenwalner et al. |

FOREIGN PATENT DOCUMENTS

| | | |
|---|---|---|
| WO | 2011161721 A1 | 12/2011 |
| WO | 2014162969 A1 | 10/2014 |

OTHER PUBLICATIONS

International Search Report and Written Opinion for International Patent Application No. PCT/US2021/048335, mailed Nov. 29, 2021, 19 pages.
Vishay, "AN606 Vishay Siliconix Current Sensing Power MOSFETS," Document No. 71991, Dec. 3, 2017, 4 pages.
On Semiconductor, "AND8093/D Current Sensing Power MOSFETs," Rev. 6, Mar. 2017, 12 pages.
"International Preliminary Report on Patentability for International Patent Application No. PCTUS21048335, dated May 19, 2023, 12 pages".

* cited by examiner

PROTECTION STRUCTURES FOR SEMICONDUCTOR DEVICES WITH SENSOR ARRANGEMENTS

This invention was made with government funds under contract number DE-EE0006521 awarded by the Department of Energy. The U.S. Government has certain rights in this invention.

FIELD OF THE DISCLOSURE

The present disclosure is related to semiconductor devices, and in particular to protection structures for semiconductor devices with sensor arrangements.

BACKGROUND

Semiconductor devices such as transistors and diodes are ubiquitous in modern electronic devices. Wide bandgap semiconductor material systems such as gallium nitride (GaN) and silicon carbide (SiC) are being increasingly utilized in semiconductor devices to push the boundaries of device performance in areas such as switching speed, power handling capability, and thermal conductivity. Examples include individual devices such as metal-oxide-semiconductor field-effect transistors (MOSFETs), insulated gate bipolar transistors (IGBTs), Schottky barrier diodes, PiN diodes, high electron mobility transistors (HEMTs), and integrated circuits such as monolithic microwave integrated circuits (MMICs) that include one or more individual devices.

Semiconductor devices for power switching applications typically include a device region of a semiconductor die that in some cases can be surrounded by an edge termination region. The device region forms an active portion or region, while the edge termination region forms an inactive portion of the power semiconductor device that may serve to decrease concentrations of electric fields along device edges for prevention of breakdown at low reverse voltages. The active region of some semiconductor devices can include large numbers of unit cells that are be electrically coupled in parallel with one another between one or more electrodes for providing selective current conducting and voltage blocking capabilities for the device.

Current sensing in semiconductor devices for power switching applications is a way to monitor operating load currents for detecting and reducing possible failure mechanisms like overcurrent or short-circuit events. In the example of a MOSFET or a metal-insulator-semiconductor field-effect transistor (MISFET), current sensing may be accomplished by providing a separate source contact for a small number of active region unit cells. The separate source contact is arranged to form a separate path for a proportionally small amount of an overall device load current. The amount of the load current along the separate path can be measured and used to calculate the overall load current along the remainder of the device. While current sensing arrangements in semiconductor devices have been proposed, the conventional structures may not be suitable for withstanding various adverse operating conditions that may be experienced.

The art continues to seek improved semiconductor devices with current sensing that are capable of overcoming challenges associated with conventional semiconductor devices.

SUMMARY

The present disclosure is related to semiconductor devices, and in particular to protection structures for semiconductor devices that include sensor arrangements. A semiconductor device may include a sensor region, for example a current sensor region that occupies a portion of an overall active area of the device. The current sensor region may be configured to provide monitoring of device load currents during operation. Semiconductor devices according to the present disclosure include one or more protection structures that are configured to allow the semiconductor devices to withstand transient voltage events without device failure. A protection structure may include an insulating layer that is provided in a transition region between a device region and the sensor region of the semiconductor device. In the example of an insulated gate semiconductor device, the insulating layer of the protection structure may include a material with a greater breakdown voltage than a breakdown voltage of a gate insulating layer.

In one aspect, a semiconductor device comprises: a drift region; a device region that comprises a first portion of the drift region; a sensor region that comprises a second portion of the drift region; and a transition region arranged between the device region and the sensor region, the transition region comprising: a gate contact; a gate insulating layer arranged between the gate contact and the drift region; and an insulating layer arranged between the gate contact and the drift region, the insulating layer comprising a breakdown voltage that is higher than a breakdown voltage of the gate insulating layer. The sensor region may form a current sensor. In certain embodiments, the first portion of the drift region is electrically connected between a first contact and a second contact and the second portion of the drift region is electrically connected between the first contact and a sensor contact. In certain embodiments, the semiconductor device comprises a metal-oxide-semiconductor field-effect transistor (MOSFET), and the first contact is a drift contact and the second contact is a source contact. In certain embodiments, a top surface of the drift region in the transition region is devoid of the insulating layer. The breakdown voltage of the insulating layer may be at least 1.5 times greater than the breakdown voltage of the gate insulating layer, or in a range from 1.5 times greater to 200 times greater, or in a range from 1.5 times greater to 200 times greater than the breakdown voltage of the gate insulating layer. In certain embodiments, a thickness of the insulating layer is at least 1.5 times greater than a thickness of the gate insulating layer, or in a range from 1.5 times greater to 100 times greater than the thickness of the gate insulating layer. In certain embodiments, the thickness of the insulating layer is at least 2 times greater than the thickness of the gate insulating layer, or in a range from 2 times greater to 100 times greater than the thickness of the gate insulating layer. In certain embodiments, the insulating layer forms a ring around lateral edges of the sensor region. In certain embodiments, a portion of the insulating layer has a thickness that is greater than thicknesses of other portions of the insulating layer. In certain embodiments, the drift region comprises a doped region that is registered with the transition region, the doped region comprising a doping type that is opposite a doping type of the drift region. In certain embodiments, the insulating layer is on the doped region and a width of the insulating layer is less than a width of the doped region. In certain embodiments, the insulating layer is on the doped region and the width of the insulating layer is the same as the width of the doped region.

In another aspect, a silicon carbide (SiC) MOSFET device comprises a device region and a current sensor region, wherein the SiC MOSFET device is configured to withstand a rate of voltage change over time (dV/dt) of at least 10 kilovolts per microsecond (kV/μs). In certain embodiments, the dV/dt is at least kV/μs, or at least 50 kV/μs, or at least 100 kV/μs, or in a range from 10 kV/μs to 100 kV/μs, or in a range from 10 kV/μs to 200 kV/μs. In certain embodiments, the SiC MOSFET device is configured to withstand the dV/dt in a range from one cycle to one thousand cycles. In certain embodiments, the MOSFET device further comprises: a drift region that forms part of the current sensor region and the device region, wherein the current sensor region is laterally spaced from the device region by a transition region; a gate contact and a gate insulating layer, wherein the gate insulating layer is between the gate contact and the drift region; an insulating layer in the transition region, wherein the insulating layer is arranged between the gate contact and the drift region, and the insulating layer comprises a breakdown voltage that is higher than a breakdown voltage of the gate insulating layer. In certain embodiments, a thickness of the insulating layer is in a range from 1.5 times greater to 50 times greater than a thickness of the gate insulating layer.

In another aspect, a semiconductor device comprises: a drift region; a device region that comprises a first portion of the drift region; a sensor region that comprises a second portion of the drift region; and a transition region arranged between the device region and the sensor region, the transition region comprising: a gate contact; a gate insulating layer arranged between the gate contact and the drift region; and an insulating layer arranged between the gate contact and the drift region, the insulating layer comprising a thickness that is greater than a thickness of the gate insulating layer. In certain embodiments, the thickness of the insulating layer is at least 1.5 times greater than the thickness of the gate insulating layer, or in a range from 1.5 times greater to 100 times greater than the thickness of the gate insulating layer. In certain embodiments, the thickness of the insulating layer is at least 2 times greater than the thickness of the gate insulating layer, or in a range from 2 times greater to 100 times greater than the thickness of the gate insulating layer. In certain embodiments, the sensor region forms a current sensor. In certain embodiments, the first portion of the drift region is electrically connected between a first contact and a second contact, and the second portion of the drift region is electrically connected between the first contact and a sensor contact. In certain embodiments, the semiconductor device comprises a MOSFET, and the first contact is a drift contact and the second contact is a source contact.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure is related to semiconductor devices, and in particular to protection structures for semiconductor devices that include sensor arrangements. A semiconductor device may include a sensor region, for example a current sensor region that occupies a portion of an overall active area of the device. The current sensor region may be configured to provide monitoring of device load currents during operation. Semiconductor devices according to the present disclosure include one or more protection structures that are configured to allow the semiconductor devices to withstand transient voltage events without device failure. A protection structure may include an insulating layer that is provided in a transition region between a device region and the sensor region of the semiconductor device. In the example of an insulated gate semiconductor device, the insulating layer of the protection structure may include a material with a greater breakdown voltage than a breakdown voltage of a gate insulating layer.

Figure 1:
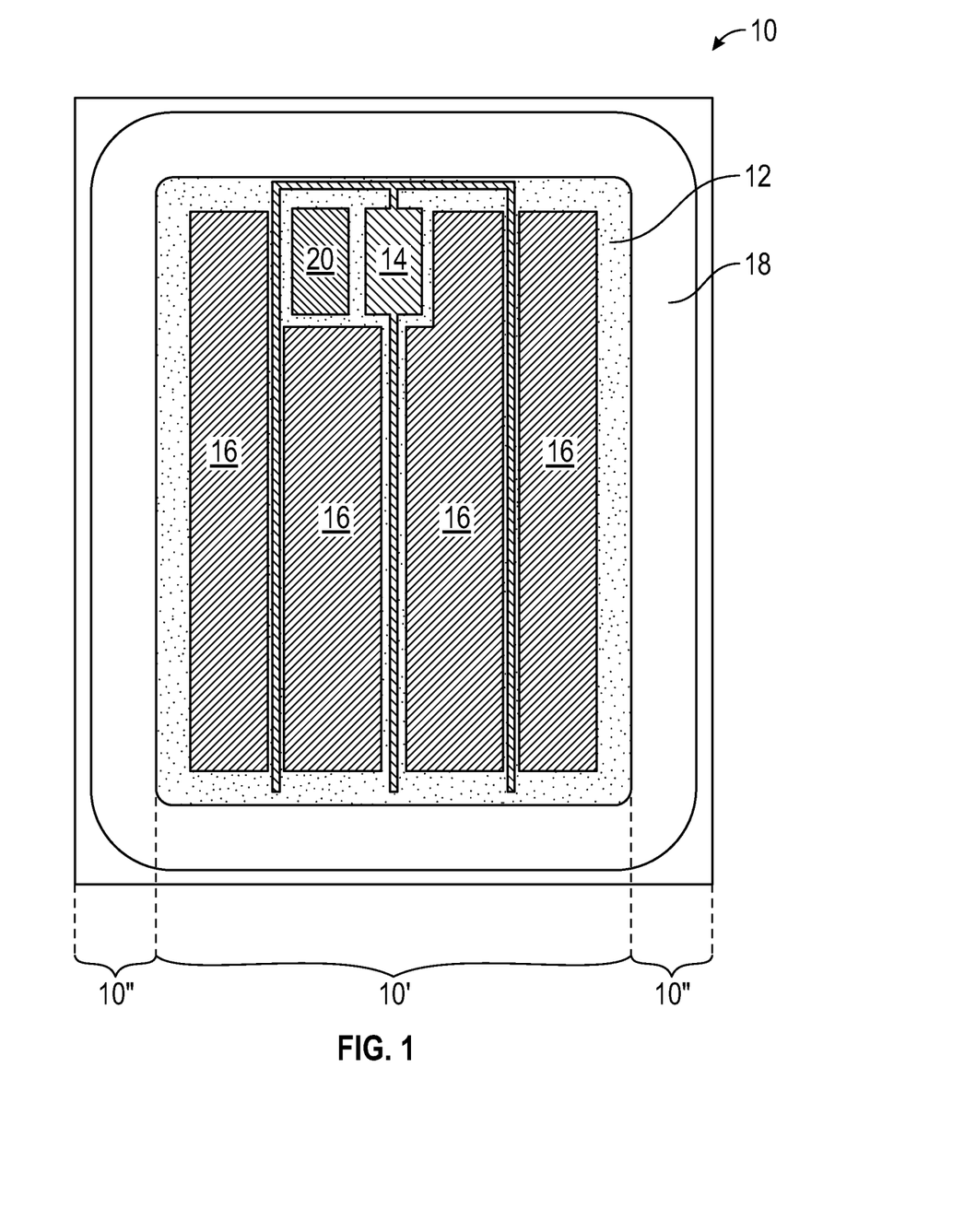
FIG. 1 is an illustration of a top view layout for an exemplary semiconductor device according to embodiments of the present disclosure.

FIG. 1 is an illustration of a top view layout for an exemplary semiconductor device 10 according to embodiments of the present disclosure. For purposes of illustration, the semiconductor device 10 is a vertical metal-oxide-semiconductor field-effect transistor (MOSFET) device including a passivation structure 12 formed with openings for a gate contact 14 and a number of source contacts 16. The gate contact 14 and the source contacts 16 may also respectively be referred to as a gate contact pad and source contact pads. While a MOSFET is illustrated, the principles of the present disclosure are applicable to other semiconductor devices, for example other MOSFETs, metal-insulator-field-effect transistors (MISFETs), diodes, Schottky diodes, junction barrier Schottky (JBS) diodes, PiN diodes, and insulated gate bipolar transistors (IGBTs), among others. The semiconductor device 10 may embody wide bandgap semiconductor devices, for example silicon carbide (SiC)-based devices, and still further 4H-SiC based devices. The semiconductor device 10 is a vertical power device in which a drain contact pad (not shown) is located on a backside of the device 10. The gate contact 14 and the source contacts 16 may be provided as surfaces for coupling the semiconductor device 10 to external circuitry. An edge termination region 18 may be arranged along a perimeter of the device 10. The edge termination region 18 may be arranged to reduce a concentration of an electric field at the edges of the semiconductor device 10 in order to improve the performance thereof. For example, the edge termination region 18 may increase a breakdown voltage of the semiconductor device 10 and/or decrease a leakage current of the semiconductor device 10 over time. By way of example, the edge termination region 18 may include one or more guard rings, a junction termination extension (JTE), and combinations thereof.

The semiconductor device 10 may further comprise a sensor contact 20, or sensor contact pad. The sensor contact 20 may provide a contact for any type of sensor that is at least partially incorporated within the semiconductor device 10, for example a temperature sensor, a strain sensor, or a current sensor. In the case of a current sensor, a current sensor region that corresponds with the sensor contact 20 may occupy an area of the semiconductor device 10 that would otherwise form part of an active region 10' for the semiconductor device 10. In the example of FIG. 1, the edge termination region 18 may serve to delineate an active region 10' of the semiconductor device 10 from an inactive region 10" of the semiconductor device 10, and the sensor contact 20 defines the current sensor region that would otherwise form part of an active region 10'. In this regard, the sensor contact 20 may generally have a size that is smaller than a size of the remaining active region of the semiconductor device 10. The sensor contact 20 provides a contact pad that may be electrically connected, for example by a wirebond or other electrical connection, to one or more external circuit elements for sensor monitoring. In the case of a current sensor, the sensor contact 20 may be electrically connected to one or more external circuit elements for monitoring a portion of the load current that flows in the sensor region of the semiconductor device 10 that is electrically coupled to the sensor contact 20.

Figures 2A, 2B:
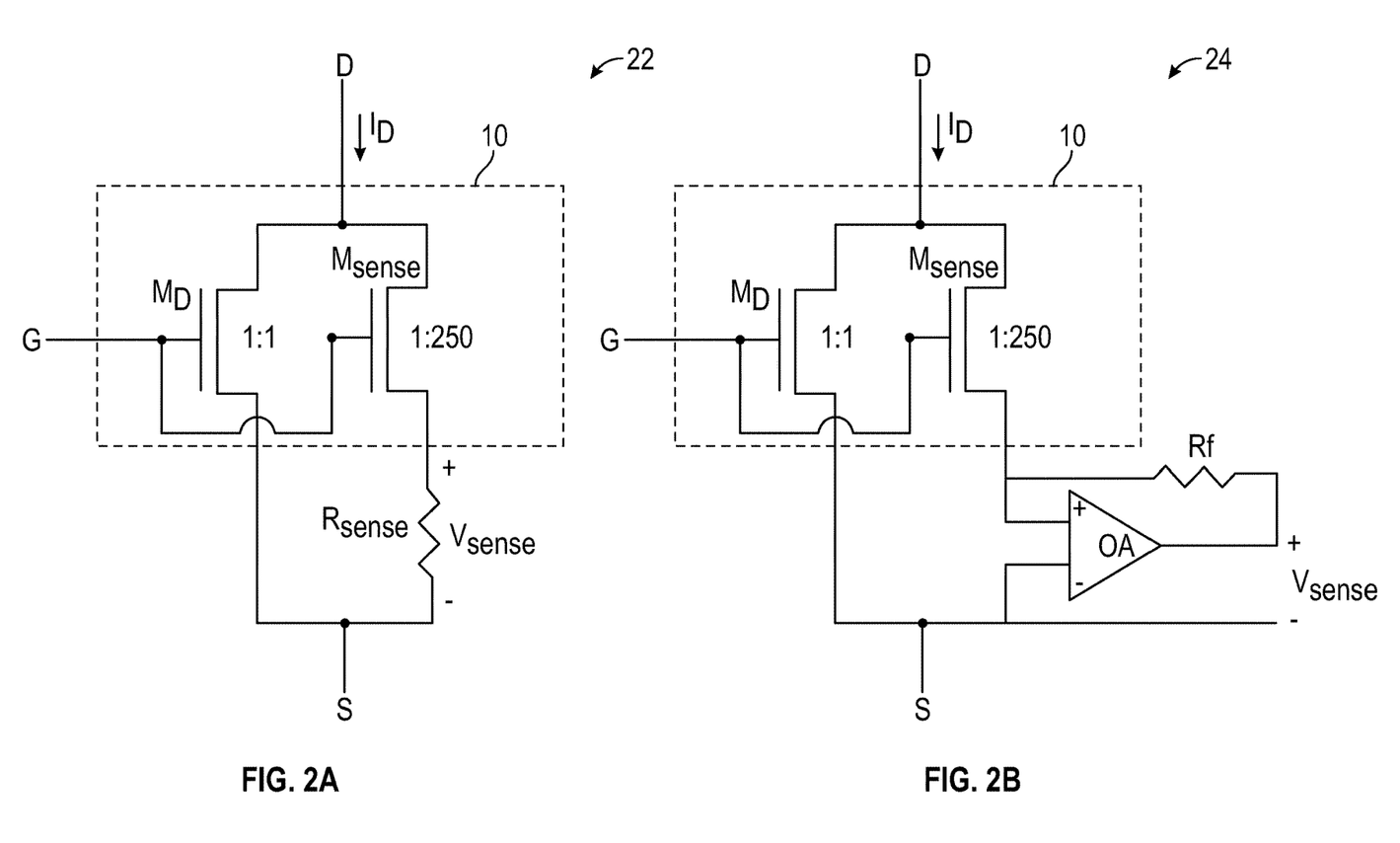
FIG. 2A represents an equivalent circuit for an implementation of a current sensor for a metal-oxide-semiconductor field-effect transistor (MOSFET) or metal-insulator-semiconductor field-effect transistor (MISFET) arrangement example according to principles of the present disclosure.
FIG. 2B represents another equivalent circuit for an implementation of a current sensor for a MOSFET or MISFET arrangement example according to principles of the present disclosure.

FIGS. 2A and 2B represent equivalent circuits for implementations of a current sensor for a MOSFET or MISFET arrangement according to principles of the present disclosure. FIG. 2A illustrates an equivalent circuit 22 where the source contact 20 of FIG. 1 is electrically coupled to a sense resistor ($R_{sense}$). A dashed-line box in FIG. 2A represents the semiconductor device 10 of FIG. 1 with the remaining portion of the equivalent circuit 22 being external to the semiconductor device 10. By forming the sensor contact (20 of FIG. 1) as a separate source contact, the semiconductor device 10 thereby includes a device MOSFET ($M_D$) and a sensing MOSFET ($M_{sense}$) that are connected to a common drain and a common gate. Source connections for each of the MOSFETs ($M_D$ and $M_S$) are coupled in parallel so that the current flow from the drain (ID) may be split across the MOSFETs ($M_D$ and $M_{sense}$). The ratio of current flow from the source of the device MOSFET to the current flow from the source of the sensing MOSFET corresponds to a ratio of the area of the semiconductor device 10 that is occupied by the active region to the area of the semiconductor device 10 that is occupied by the sensor region. By way of example, FIG. 2A illustrates an embodiment where the ratio of current flow is set at 1:250 based on the relative areas of the active region and the sensor region. In this manner, when 1 amp (A) of current flows through the semiconductor device 10, 4 milliamps (mA) of current will flow from the source path of the sensing MOSFET ($M_{sense}$). By arranging the sense resistor ($R_{sense}$) along the source path from the sensing MOSFET ($M_{sense}$), the corresponding sense voltage ($V_{sense}$) may be measured and correlated to the load current of the device MOSFET ($M_D$) according to the ratio described above. Other current sensing configurations are possible with the arrangement of the semiconductor device 10. For example, FIG. 2B illustrates an equivalent circuit 24 for a virtual ground configuration for the portion that is external to the semiconductor device 10. Virtual ground sensing may be used in applications where a higher value of the sense voltage ($V_{sense}$) is needed. In this configuration, an operational amplifier (OA) and a feedback resistor (Rf) are coupled to the source path from the sensing MOSFET ($M_{sense}$). In this manner, the sense voltage ($V_{sense}$) may be calculated based on the feedback resistor (Rf) and an output of the operational amplifier (OA).

Figure 3:
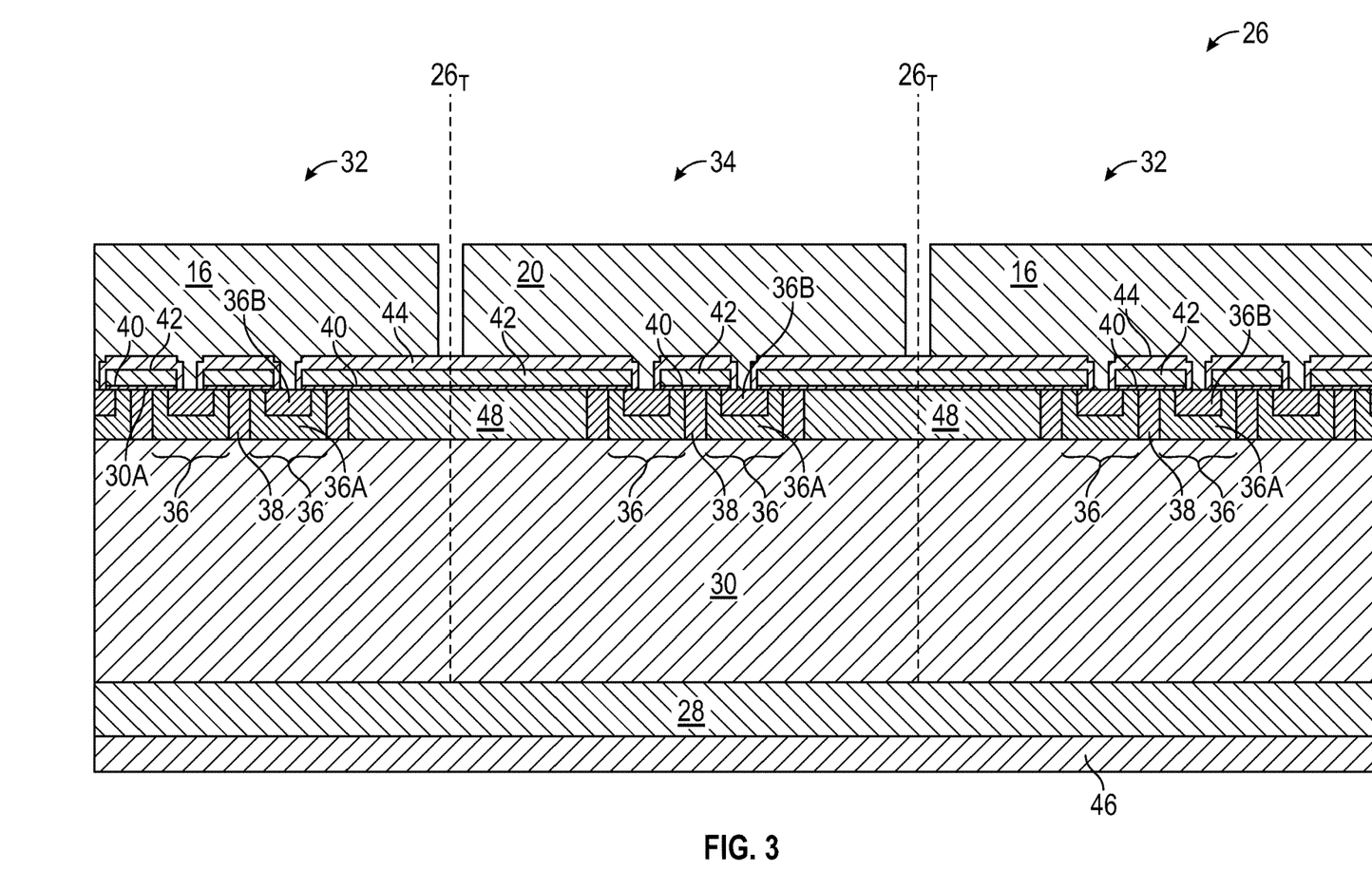
FIG. 3 illustrates a cross-sectional view of a portion of a semiconductor device that includes a sensor contact that is integrated within the semiconductor device.

FIG. 3 illustrates a cross-sectional view of a portion of a semiconductor device 26 that includes the sensor contact 20 of FIG. 1. By way of example, the semiconductor device 26 is arranged as a planar MOSFET, but the principles of the present disclosure are applicable to other semiconductor devices, including trench MOSFETs, MISFETs, diodes, Schottky diodes, JBS diodes, PiN diodes, and IGBTs, among others. The semiconductor device 26 includes a substrate 28 and a drift region 30 on the substrate 28. The drift region 30 may embody one or more drift layers of a wide bandgap semiconductor material, for example SiC. The substrate 28 may have a doping concentration between $1 \times 10^{17}$ $cm^{-3}$ and $1 \times 10^{20}$ $cm^{-3}$. In various embodiments, the doping concentration of the substrate 28 may be provided at any subrange between $1 \times 10^{17}$ $cm^{-3}$ and $1 \times 10^{20}$ $cm^{-3}$. For example, the doping concentration of the substrate 28 may be between $1 \times 10^{18}$ $cm^{-3}$ and $1 \times 10^{20}$ $cm^{-3}$, between $1 \times 10^{19}$ $cm^{-3}$ and $1 \times 10^{20}$ $cm^{-3}$, between $1 \times 10^{17}$ $cm^{-3}$ and $1 \times 10^{19}$ $cm^{-3}$, between $1 \times 10^{17}$ $cm^{-3}$ and $1 \times 10^{18}$ $cm^{-3}$, and between $1 \times 10^{18}$ $cm^{-3}$ and $1 \times 10^{19}$ $cm^{-3}$.

The drift region 30 may have a doping concentration between $1 \times 10^{14}$ $cm^{-3}$ and $1 \times 10^{18}$ $cm^{-3}$. In various embodiments, the doping concentration of the drift region 30 may be provided at any subrange between $1 \times 10^{14}$ $cm^{-3}$ and $1 \times 10^{18}$ $cm^{-3}$. For example, the doping concentration of the drift region 30 may be between $1 \times 10^{15}$ $cm^{-3}$ and $1 \times 10^{18}$ $cm^{-3}$, between $1 \times 10^{16}$ $cm^{-3}$ and $1 \times 10^{18}$ $cm^{-3}$, between $1 \times 10^{17}$ $cm^{-3}$ and $1 \times 10^{18}$ $cm^{-3}$, between $1 \times 10^{14}$ $cm^{-3}$ and $1 \times 10^{17}$ $cm^{-3}$, between $1 \times 10^{14}$ $cm^{-3}$ and $1 \times 10^{16}$ $cm^{-3}$, between $1 \times 10^{14}$ $cm^{-3}$ and $1 \times 10^{15}$ $cm^{-3}$, between $1 \times 10^{15}$ $cm^{-3}$ and $1 \times 10^{17}$ $cm^{-3}$, between $1 \times 10^{15}$ $cm^{-3}$ and $1 \times 10^{16}$ $cm^{-3}$, and between $1 \times 10^{16}$ $cm^{-3}$ and $1 \times 10^{17}$ $cm^{-3}$.

Vertical dashed lines are provided to indicate one or more transition regions $26_T$ of the semiconductor device 26 that delineate a device region 32 from a sensor region 34. For embodiments with a single integrated sensor contact 20 as illustrated in the top view of FIG. 1, the transition region $26_T$ indicated by the dashed lines in FIG. 3 may be a continuous transition region $26_T$ that surrounds the sensor contact 20. The semiconductor device 26 may include a number of unit cells in both the device region 32 and the sensor region 34 that are electrically coupled in parallel with one another as illustrated by the equivalent circuits of FIGS. 2A and 2B. In FIG. 3, each MOSFET cell includes a pair of junction implants 36 that are provided in the drift region 30, and specifically in a top surface 30A of the drift region 30 opposite the substrate 28. The junction implants 36 include a first well region 36A having a doping type that is opposite that of the drift region 30 and a second well region 36B having a doping type that is the same as that of the drift region 30. The junction implants 36 may be separated from one another by a junction field-effect transistor (JFET) region 38. The JFET region 38 has the same doping type as that of the drift region 30 and in some embodiments, a higher doping concentration than that of the drift region 30. A number of the source contacts 16 are provided over the junction implants 36 on the top surface 30A of the drift region 30 in the device region 32 such that each source contact 16 contacts a portion of the first well region 36A and the second well region 36B. In a similar manner, the sensor contact 20 is provided over the junction implants 36 on the top surface 30A of the drift region 30 in the sensor region 34 such that each sensor contact 20 contacts a portion of the corresponding first well region 36A and the second well region 36B. In this regard, the sensor contact 20 may form a separate source contact for the sensor region 34. In certain embodiments, the drift region 30 and the second well region 36B may comprise n-type doping while the second well region 36A comprises p-type doping, although reverse polarity configurations are also applicable to the present disclosure.

A gate insulating layer 40, or gate oxide layer depending on the device type, is provided on the top surface 30A of the drift region 30 opposite the substrate 28 over the JFET regions 38 and a portion of each one of the junction implants 36 such that the gate insulating layer 40 partially overlaps each one of the second well regions 36B. The gate insulating layer 40 may comprise a thin layer of silicon dioxide in certain embodiments, for example MOSFET configurations where the gate insulating layer 40 may be referred to as a gate oxide layer. In other embodiments, the gate insulating layer 40 may comprise any insulating material, including non-oxide insulating materials and other oxide materials beyond silicon dioxide. A gate contact 42 is provided on the gate insulating layer 40. As illustrated, the gate contact 42 and the gate oxide may be provided for the MOSFET cells in both the device region 32 and the sensor region 34 and across the transition region $26_T$. The gate contact 42 for each of the MOSFET cells in both the device region 32 and the sensor region 34 may be coupled to the same gate contact pad 14 of FIG. 1. In alternative configurations, the semiconductor device 26 may embody a trench MOSFET where portions of the gate contact 42 and the gate insulating layer 40 may reside in a trench of the drift region 30 without deviating from the principles of the present disclosure. A passivation layer 44 is provided over the gate contact 42 to provide electrical insulation with the source contact 16 and the sensor contact 20. In certain embodiments, the passivation layer 44 may comprise one or more dielectric layers that are referred to as inter-metal dielectrics. The MOSFET cells may be tiled across the device region 32 and the sensor region 34 or tiled in a desired pattern with one or more other semiconductor devices (e.g., diodes) to provide a desired functionality.

A drain contact 46 is provided on a surface of the substrate 28 opposite the drift region 30. Accordingly, the portion of the drift region 30 and corresponding MOSFET cells that are arranged in the device region 32 are electrically connected between the drain contact 46 and the source contact 16. In a similar manner, the portion of the drift region 30 and corresponding MOSFET cells that are arranged in the sensor region 34 are electrically connected between the drain contact 46 and the sensor contact 20. While only a small number of MOSFET cells are illustrated, a ratio of a number of MOSFET cells in the sensor region 34 to a number of MOSFET cells in the device region 32 may be on the order of 1:1, or 1:100, or 1:250, or 1:1,000,000 depending on the desired current ratios for the sensor region 34. In certain embodiments, the sensor region 34 may be arranged to occupy no more than 20%, or no more than 10%, or no more than 5% of usable active area of the semiconductor device 26 that is within the edge termination region. For current sensing applications, the sensor region 34 may be referred to as a current sensor region. A doped region 48 of the drift region 30 may be provided that is registered with the transition region $26_T$. The doped region 48 may comprise a doping type that is the same as that of the first well regions 36A and opposite that of the drift region 30. In this regard, the doped region 48 may be configured to shield portions of the gate contact 42 that extend across the transition region $26_T$. However, in this layout, the semiconductor device 26 may be vulnerable to transient voltage events that may occur during operation and/or device testing. In particular, a high rate of voltage change over time (dV/dt) can be induced during switching events. The high dV/dt may cause dielectric breakdown or other defects and damage in the gate insulating layer 40 that is in the transition region $26_T$.

Figure 4:
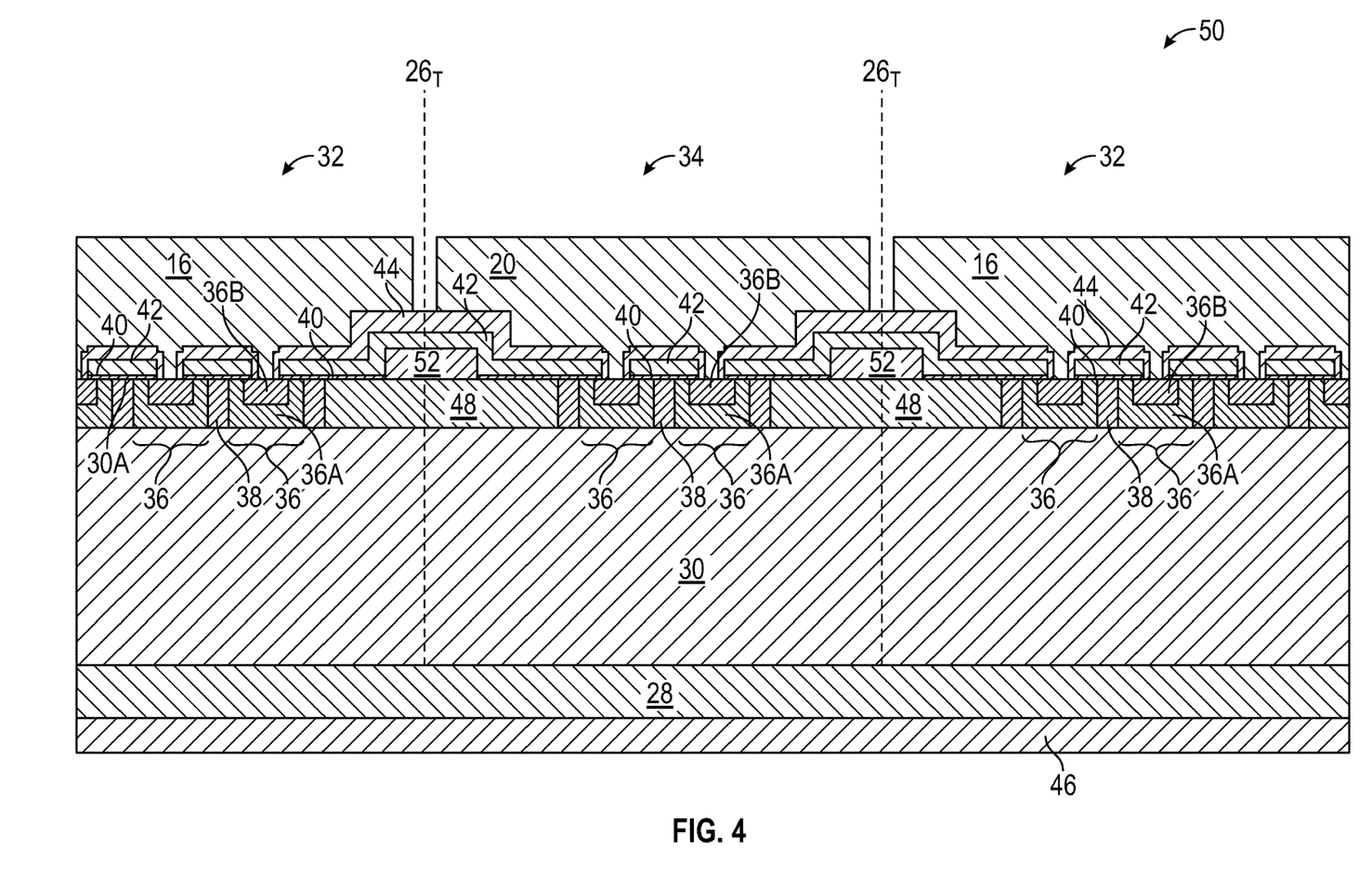
FIG. 4 illustrates a cross-sectional view of a portion of a semiconductor device that is similar to the semiconductor device of FIG. 3 and further includes protection structures arranged in a transition region for shielding a gate insulating layer from transient voltage events, defects, and other associated damage.

FIG. 4 illustrates a cross-sectional view of a portion of a semiconductor device 50 that is similar to the semiconductor device 26 of FIG. 3 and further includes protection structures arranged in the transition region $26_T$ for shielding the gate insulating layer 40 from transient voltage events, defects, and other associated damage. An insulating layer 52 is provided on the top surface 30A of the drift region 30 to provide protection for the gate insulating layer 40. The insulating layer 52 may further be provided on the top surface 30A of the drift region 30 in an area where the top surface 30A includes the doped region 48. In certain embodiments, the insulating layer 52 may be formed on the drift region 30 before the gate insulating layer 40 and the gate contact 42 are formed, thereby arranging the insulating layer 52 between the gate contact 42 and the drift region in the transition region $26_T$. In this regard, the insulating layer 52 prevents the thin gate insulating layer 40 from entirely covering the top surface 30A of the drift region 30 in the transition region $26_T$ such that at least a portion of the top surface 30A is devoid of the gate insulating layer 40 in the transition region $26_T$. Additionally, the gate insulating layer 40 may not be provided between the insulating layer 52 and the gate contact 42 in the transition region $26_T$, thereby reducing the overall presence of the gate insulating layer 40. In any of the above-described arrangements, the insulating layer 52 provides a shield or barrier that reduces the impact of transient voltage events along the transition region $26_T$, where the gate insulating layer 40 is most susceptible to damage. In particular, weak spots formed by the interface between the gate insulating layer and the top surface 30A of the drift region 30 along the transition region $26_T$ are reduced.

In certain embodiments, the insulating layer 52 comprises a structure that has a higher breakdown voltage than a breakdown voltage of the gate insulating layer 40. For example, the breakdown voltage of the insulating layer 52 may be at least 1.5 times greater, or at least 2 times greater, or at least 3 times greater, or at least 5 times greater, or at least 10 times greater, or at least 50 times greater, or at least 100 times greater, or at least 200 times greater than the breakdown voltage of the gate insulating layer 40, or any range with endpoints defined by any of the preceding values. For example, the breakdown voltage of the insulating layer 52 may be in a range from 1.5 times greater to 200 times greater, or in a range from 1.5 times greater to 100 times greater, or in a range from 5 times greater to 100 times, or in a range from 5 times greater to 200 times greater than the breakdown voltage of the gate insulating layer 40. In a particular example, the insulting layer 52 comprises a breakdown voltage in a range from 650 volts (V) to 750 V while the gate insulating layer 40 comprises a breakdown voltage in a range from 40 V to 60 V. In certain embodiments, the insulating layer 52 may comprise a different material that has a higher breakdown voltage than the material of the gate insulating layer 40. In such embodiments, thicknesses of the insulating layer 52 and the gate insulating layer may be the same or different, as long as the insulating layer 52 has the higher breakdown voltage. In other embodiments, the insulating layer 52 and the gate insulating layer 40 may comprise a same material and the higher breakdown voltage is achieved by providing the insulating layer 52 with a thickness or height from the drift region 30 that is thicker than a corresponding thickness or height of the gate insulating layer 40. For example, the thickness of the insulating layer 52 may be at least 1.5 times, or at least 2 times, or at least 3 times, or at least 100 times the thickness of the gate insulating layer 40, or in a range from 1.5 times to 50 times, or in a range from 1.5 times to 100 times, or in a range from 2 times to 50 times, or in a range from 2 times to 100 times the thickness of the gate insulating layer 40. In a particular example, the insulating layer 52 comprises a thickness in a range from 550 nanometers (nm) to 650 nm and the gate insulating layer 40 comprises a thickness in a range from 30 nm to 50 nm. For MOSFET applications, the gate insulating layer 40 may comprise a gate oxide and the insulating layer 52 may comprise a thicker field oxide layer as described above. In such embodiments, both the gate insulating layer 40 and the insulating layer 52 may comprise silicon dioxide, among other gate oxides used in MOSFET applications.

By having the protection structure provided by the insulating layer 52, the overall structure of the semiconductor device 50 is more robust for handling transient voltage events, including one or more dV/dt events that may be induced during high speed switching. For example, a SiC MOSFET device with the insulating layer 52 of the present disclosure may thereby be configured to withstand or be rated for a dV/dt of at least 10 kilovolts per microsecond (kV/µs) without device failure. In still further embodiments, the SiC MOSFET device is configured to withstand a dV/dt of at least 30 kV/µs, or at least 50 kV/µs, or at least 100 kV/µs, or in a range from 10 kV/µs to 100 kV/µs, or in a range from 10 kV/µs to 200 kV/µs, or in a range from 50 kV/µs to 150 kV/µs, or in a range from 100 kV/µs to 200 kV/µs, or in any range with endpoints determined by any of the preceding values without device failure. In still further embodiments, the SiC MOSFET device is capable of withstanding any of the above dV/dt values for a single switching cycle to at least 1000 switching cycles or more. In any of the above-described embodiments, the exemplary SiC MOSFET may comprise a 4H-SiC MOSFET device.

Figure 5:
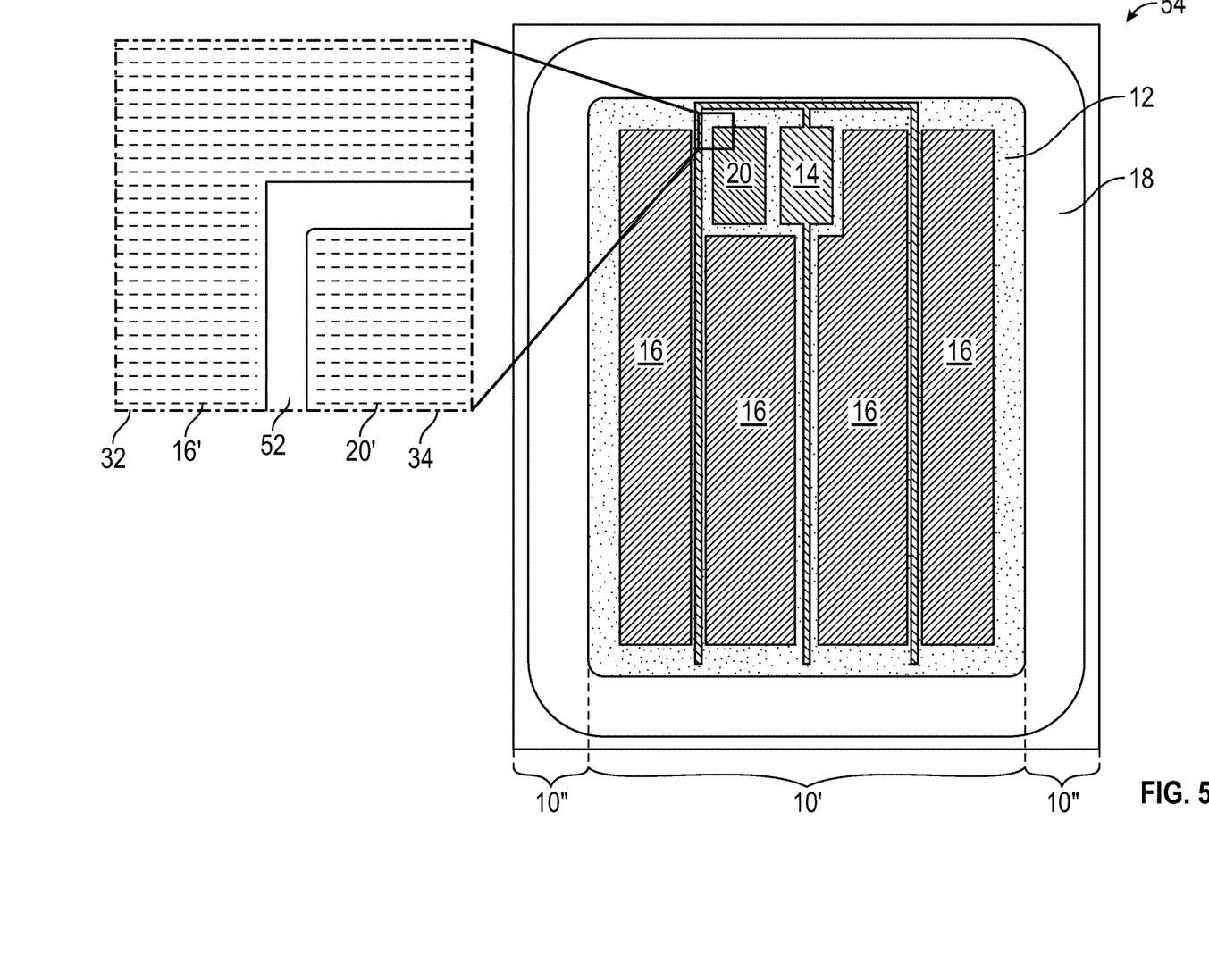
FIG. 5 is an illustration of a top view layout for a semiconductor device that illustrates an arrangement of a protection structure relative to a sensor contact according to embodiments of the present disclosure.

FIG. 5 is an illustration of a top view layout for a semiconductor device 54 that illustrates a protection structure arrangement of the insulating layer 52 relative to the sensor contact 20 according to embodiments of the present disclosure. A portion of the semiconductor device 54 is provided in exploded view to the left of the illustration. For illustrative purposes, the overlying sensor contact 20, the source contact 16, and the passivation structure 12 are omitted in the image portion of the exploded view. As such, portions 20' of the sensor contact 20, or extensions thereof, that form ohmic contacts to the drift region 30 are illustrated in an array that forms parts of unit cells of the sensor region 34 as previously described. In a similar manner, portions 16' of the source contact 16, or extensions thereof, that form ohmic contacts to the drift region 30 are illustrated in an array that forms parts of unit cells of the device region 32. The portions 16' may also represent contact metals that are patterned underneath the passivation structure 12 and outside of the source contacts 16. As illustrated, the insulating layer 52 may form one or more continuous rings around lateral edges of the sensor contact 20 and the sensor region 34 to provide delineation between the sensor region 34 and the device region 32.

Figure 6:
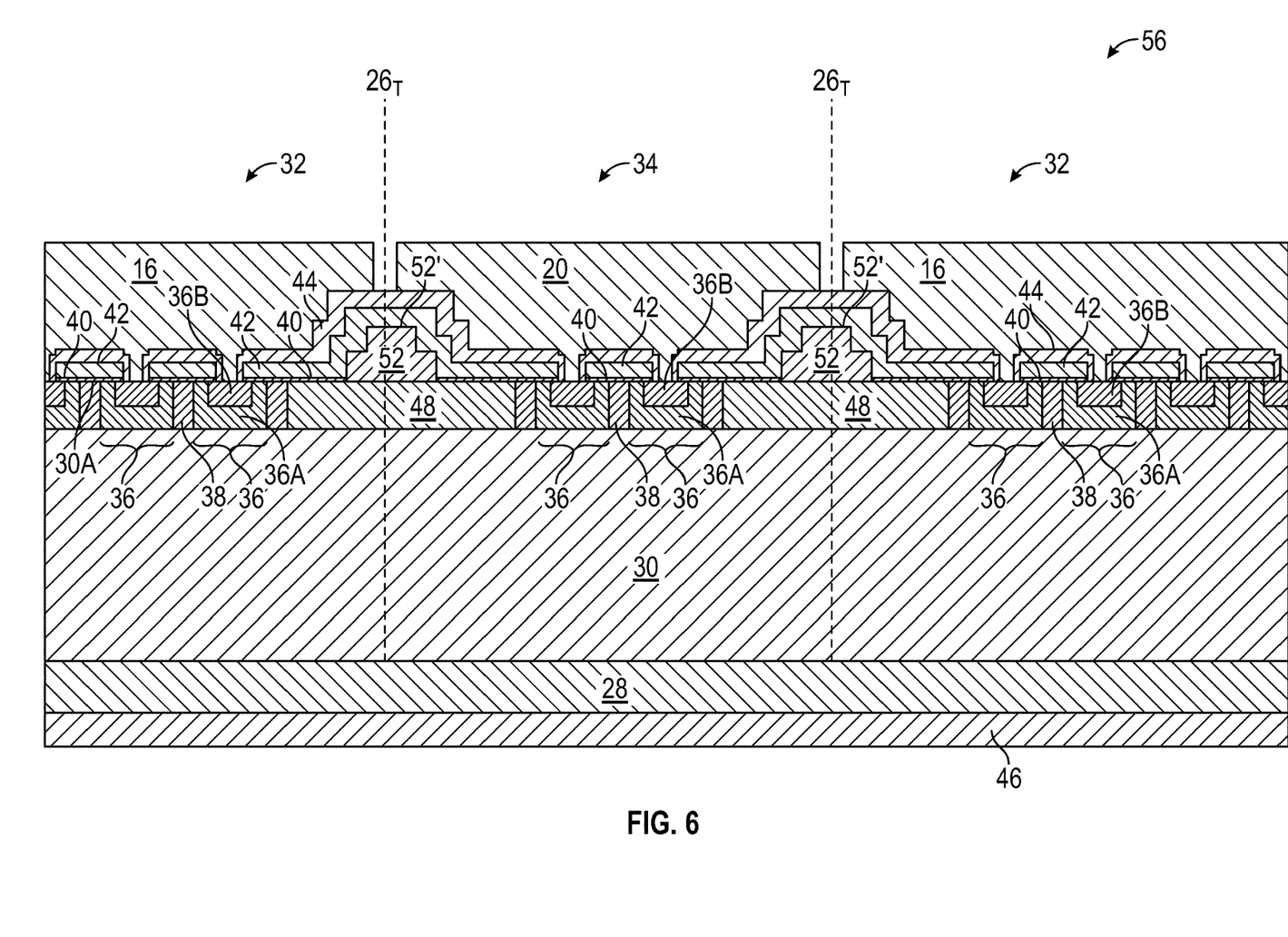
FIG. 6 illustrates a cross-sectional view of a portion of a semiconductor device that is similar to the semiconductor device of FIG. 4 for embodiments where the insulating layer forms a nonplanar shape.

FIG. 6 illustrates a cross-sectional view of a portion of a semiconductor device 56 that is similar to the semiconductor device 50 of FIG. 4 for embodiments where the insulating layer 52 forms a nonplanar shape. In FIG. 6, a thicker portion 52' of the insulating layer 52 is formed along a center of the insulating layer 52 to form one or more nonplanar surfaces thereof that are opposite the drift region 30. In this manner, an increased amount of the protection structure provided by the insulating layer 52 may be formed in the transition region $26_T$ without increasing a lateral footprint of the insulating layer 52 with respect to the drift region 30. While the increased thickness portion 52' of the insulating layer 52 is illustrated at the center of the insulating layer 52, the increased thickness portion 52' may be arranged closer to either the sensor region 34 or the device region 32 depending on the embodiment. In further embodiments, the insulating layer 52 may be formed with multiple increased thickness portions 52'. In FIG. 6, the increased thickness portion 52' forms a stepped profile for the insulating layer 52. In other embodiments, the increased thickness portion 52' may form a peak that is sloped in one or more of a linear and/or curved manner toward the lateral edges of the insulating layer 52.

Figure 7:
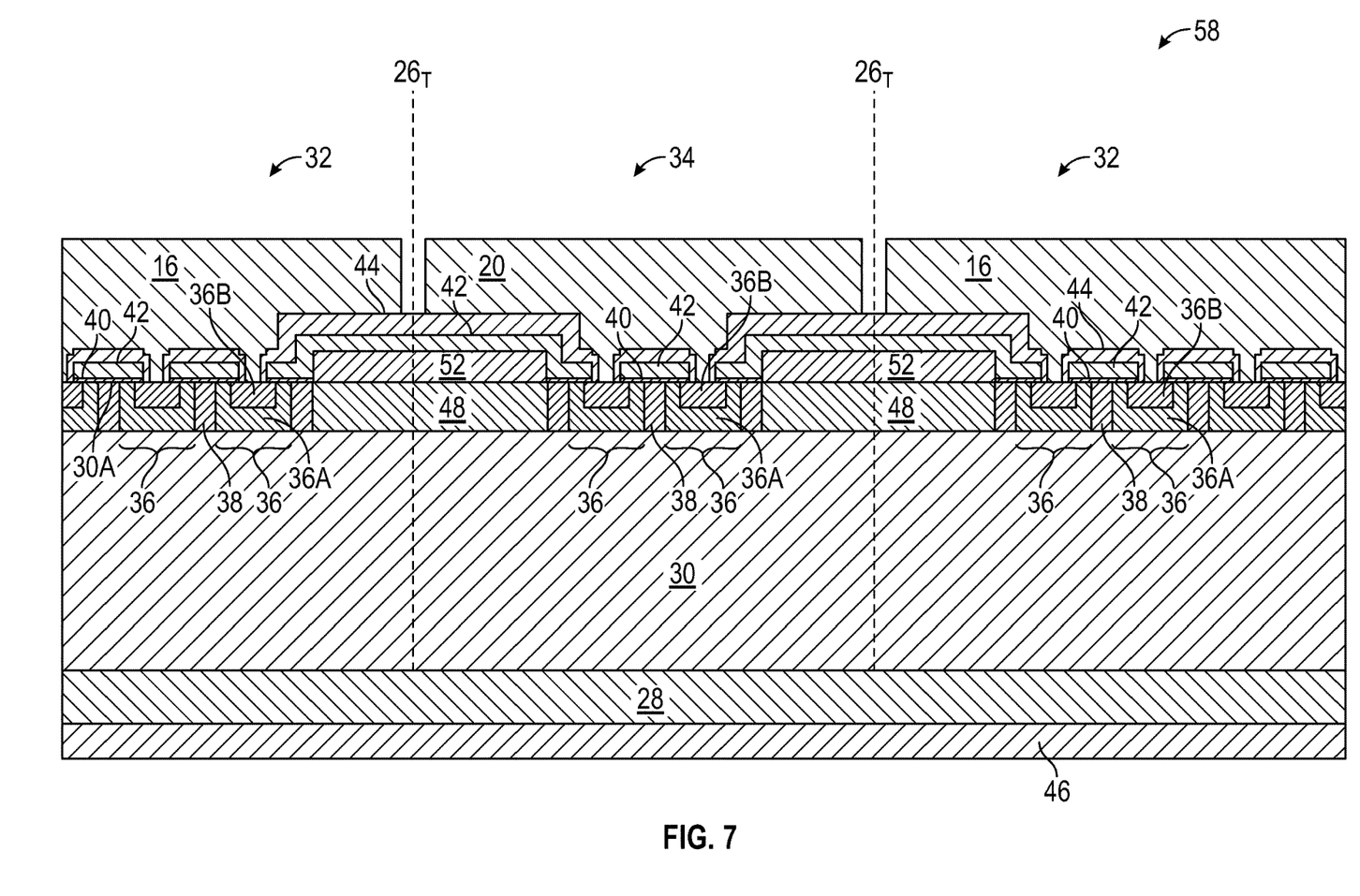
FIG. 7 illustrates a cross-sectional view of a portion of a semiconductor device that is similar to the semiconductor device of FIG. 4 for embodiments where the insulating layer is formed to cover a larger portion of a top surface of a drift region along the transition region of the semiconductor device.

FIG. 7 illustrates a cross-sectional view of a portion of a semiconductor device 58 that is similar to the semiconductor device 50 of FIG. 4 for embodiments where the insulating layer 52 is formed to cover a larger portion of the top surface 30A of the drift region 30. As illustrated, the insulating layer 52 may be formed with a lateral width that is close to or the same as a lateral width of the doped region 48 of the drift region 30. In this manner, the amount of material for the gate insulating layer 40 may be further reduced in areas of the semiconductor device 58 that are along the transition region $26_T$. For embodiments where the gate insulating layer 40 does not form over the insulating layer 52, the gate insulating layer 40 is therefore spaced farther away from the transition region $26_T$ to further reduce the impact from transient voltage events. While the insulating layer 52 is shown with a same lateral width as that of the doped region 48 in FIG. 7, the insulating layer 52 may be formed with an increased width that is less than the width of the doped region 48. For example, the insulating layer 52 may be formed with a width that is at least 50%, or at least 75%, or at least 90%, or in a range from 50% to 100% of the width of the doped region 48 in various embodiments.

While the present disclosure provides exemplary embodiments that include MOSFETs, the principles of the present disclosure are also applicable to other semiconductor devices, for example MISFETs, diodes, Schottky diodes, JBS diodes, PiN diodes, and IGBTs, among others. Semiconductor devices of the present disclosure may embody wide bandgap semiconductor devices, for example SiC-based devices.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
    a drift region;
    a gate contact on the drift region;
    a gate insulating layer between the gate contact and the drift region;
    a device region that comprises a first portion of the drift region;
    a sensor region that comprises a second portion of the drift region; and
    a transition region between the device region and the sensor region, the transition region comprising an insulating layer between the gate contact and the drift region, the insulating layer comprising a first breakdown voltage that is higher than a second breakdown voltage of the gate insulating layer, the insulating layer having a cross-sectional stepped profile in the transition region and comprising a lower portion with opposing lower side surfaces and an upper portion with opposing upper side surfaces,
    wherein the upper portion of the insulating layer is on the lower portion of the insulating layer opposite the drift region.

2. The semiconductor device of claim 1, wherein the sensor region forms a current sensor.

3. The semiconductor device of claim 1, wherein the first portion of the drift region is electrically connected between a first contact and a second contact and the second portion of the drift region is electrically connected between the first contact and a sensor contact.

4. The semiconductor device of claim 3, wherein the semiconductor device comprises a metal-oxide-semiconductor field-effect transistor (MOSFET), and the first contact is a drift contact and the second contact is a source contact.

5. The semiconductor device of claim 1, wherein a top surface of the drift region in the transition region is devoid of the gate insulating layer.

6. The semiconductor device of claim 1, wherein the first breakdown voltage of the insulating layer is at least 1.5 times greater than the second breakdown voltage of the gate insulating layer, and
wherein the first breakdown voltage of the insulating layer is in a range from 650 volts to 750 volts.

7. The semiconductor device of claim 1, wherein the first breakdown voltage of the insulating layer is in a range from 1.5 times greater to 200 times greater than the second breakdown voltage of the gate insulating layer.

8. The semiconductor device of claim 1, wherein the first breakdown voltage of the insulating layer is in a range from 5 times greater to 200 times greater than the second breakdown voltage of the gate insulating layer.

9. The semiconductor device of claim 1, wherein a first thickness of the insulating layer is at least 1.5 times greater than a second thickness of the gate insulating layer, and
wherein the first thickness of the insulating layer is in a range from 550 nanometers to 650 nanometers.

10. The semiconductor device of claim 9, wherein the first thickness of the insulating layer is in a range from 1.5 times greater to 100 times greater than the second thickness of the gate insulating layer.

11. The semiconductor device of claim 1, wherein a first thickness of the insulating layer is at least 2 times greater than a second thickness of the gate insulating layer.

12. The semiconductor device of claim 11, wherein the first thickness of the insulating layer is in a range from 2 times greater to 100 times greater than the second thickness of the gate insulating layer.

13. The semiconductor device of claim 1, wherein the insulating layer forms a ring around lateral edges of the sensor region.

14. The semiconductor device of claim 1, wherein a portion of the insulating layer has a first thickness that is greater than thicknesses of other portions of the insulating layer.

15. The semiconductor device of claim 1, wherein the drift region comprises a doped region that is registered with the transition region, the doped region comprising a first doping type that is opposite a second doping type of the drift region.

16. The semiconductor device of claim 15, wherein the insulating layer is on the doped region and a first lateral width of the insulating layer is less than a second lateral width of the doped region.

17. The semiconductor device of claim 15, wherein the insulating layer is on the doped region and a first lateral width of the insulating layer is the same as a second lateral width of the doped region.

18. The semiconductor device of claim 1, wherein the lower portion of the insulating layer is thicker than the gate insulating layer, and
wherein the gate insulating layer is directly on at least one of the lower side surfaces of the lower portion of the insulating layer.

19. The semiconductor device of claim 1, wherein the upper portion of the insulating layer is laterally spaced apart evenly from the lower side surfaces of the lower portion of the insulating layer.

20. The semiconductor device of claim 1, wherein the cross-sectional stepped profile of the insulating layer comprises a first step difference between the gate insulating layer and the lower portion of the insulating layer, and a second step difference between the lower portion of the insulating layer and the upper portion of the insulating layer.

21. The semiconductor device of claim 1, wherein the gate contact is on the lower side surfaces of the lower portion of the insulating layer and the upper side surfaces of the upper portion of the insulating layer.

22. The semiconductor device of claim 1, wherein the insulating layer is a continuous layer of a same material.

23. A silicon carbide (SiC) metal-oxide-semiconductor field-effect transistor (MOSFET) device comprising a drift region, a gate contact, a gate insulating layer between the gate contact and the drift region, a device region, a current sensor region, and a transition region between the device region and the current sensor region, the transition region comprising an insulating layer with a cross-sectional stepped profile between the gate contact and the drift region, the insulating layer comprising a lower portion with opposing lower side surfaces and an upper portion with opposing upper side surfaces,
wherein the upper portion of the insulating layer is on the lower portion of the insulating layer opposite the drift region, and
wherein the SiC MOSFET device is configured to withstand a rate of voltage change over time (dV/dt) of at least 10 kilovolts per microsecond (kV/µs).

24. The MOSFET device of claim 23, wherein the dV/dt is at least 30 kV/µs.

25. The MOSFET device of claim 23, wherein the dV/dt is at least 50 kV/µs.

26. The MOSFET device of claim 23, wherein the dV/dt is at least 100 kV/µs.

27. The MOSFET device of claim 23, wherein the dV/dt is in a range from 10 kV/µs to 100 kV/µs.

28. The MOSFET device of claim 23, wherein the dV/dt is in a range from 10 kV/µs to 200 kV/µs.

29. The MOSFET device of claim 23, wherein the SiC MOSFET device is configured to withstand the dV/dt in a range from one cycle to one thousand cycles.

30. The MOSFET device of claim 23, wherein the insulating layer comprises a first breakdown voltage that is higher than a second breakdown voltage of the gate insulating layer.

31. The MOSFET device of claim 30, wherein a first thickness of the insulating layer is in a range from 1.5 times greater to 50 times greater than a second thickness of the gate insulating layer.

32. A semiconductor device comprising:
a drift region;
a gate contact on the drift region;
a gate insulating layer between the gate contact and the drift region;
a device region that comprises a first portion of the drift region;
a sensor region that comprises a second portion of the drift region; and
a transition region between the device region and the sensor region, the transition region comprising an insulating layer between the gate contact and the drift region, the insulating layer comprising a first breakdown voltage that is higher than a second breakdown voltage of the gate insulating layer,
wherein the insulating layer and the gate insulating layer have a thickness that is substantially the same.

33. The semiconductor device of claim 32, wherein the sensor region forms a current sensor.

34. The semiconductor device of claim 32, wherein the first portion of the drift region is electrically connected between a first contact and a second contact, and the second portion of the drift region is electrically connected between the first contact and a sensor contact.

35. The semiconductor device of claim 34, wherein the semiconductor device comprises a metal-oxide-semiconductor field-effect transistor (MOSFET), and the first contact is a drift contact and the second contact is a source contact.

36. A semiconductor device comprising:
- a drift region;
- a gate contact on the drift region;
- a gate insulating layer between the gate contact and the drift region;
- a device region that comprises a first portion of the drift region;
- a sensor region that comprises a second portion of the drift region;
- a transition region between the device region and the sensor region, the transition region comprising an insulating layer between the gate contact and the drift region; and
- a doped region within the drift region that is part of the transition region, the doped region comprising a first doping type that is opposite a second doping type of the drift region,
wherein the insulating layer is on the doped region and a top surface of the doped region is free of the gate insulating layer, and
wherein a thickness of the insulating layer is substantially uniform.

37. The semiconductor device of claim 36, wherein a first lateral width of the insulating layer is the same as a second lateral width of the doped region.

38. The semiconductor device of claim 36, wherein a first breakdown voltage of the insulating layer is in a range from 1.5 times greater to 200 times greater than a second breakdown voltage of the gate insulating layer.

39. The semiconductor device of claim 36, wherein the thickness of the insulating layer is in a range from 1.5 times greater to 100 times greater than a thickness of the gate insulating layer.

40. The semiconductor device of claim 36, wherein the insulating layer comprises a first material and the gate insulating layer comprises a second material different from the first material.

* * * * *

UNITED STATES PATENT AND TRADEMARK OFFICE
CERTIFICATE OF CORRECTION

| | |
|---|---|
| PATENT NO. | : 12,237,412 B2 |
| APPLICATION NO. | : 17/087740 |
| DATED | : February 25, 2025 |
| INVENTOR(S) | : Van Brunt et al. |

It is certified that error appears in the above-identified patent and that said Letters Patent is hereby corrected as shown below:

On the Title Page

Item (56), References Cited, OTHER PUBLICATIONS, Lee et al.: Please correct "Comparison etween CVD" to read --Comparison between CVD--

In the Specification

Column 7, Line 18: Please correct "(ID)" to read --($I_D$)--

Column 9, Line 65: Please correct "region in" to read --region 30 in--

Column 10, Line 13: Please correct "layer and" to read --layer 40 and--

Column 10, Line 39: Please correct "layer may" to read --layer 40 may--

Signed and Sealed this
Fifteenth Day of July, 2025

Coke Morgan Stewart
*Acting Director of the United States Patent and Trademark Office*